United States Patent
Liu et al.

(10) Patent No.: US 10,811,272 B2
(45) Date of Patent: Oct. 20, 2020

(54) METHOD OF FORMING STACKED STRUCTURE OF MEMORY

(71) Applicant: UNITED MICROELECTRONICS CORP., Hsin-Chu (TW)

(72) Inventors: Wei-Hsin Liu, Changhua County (TW); Ta-Wei Chiu, Changhua County (TW); Chia-Lung Chang, Tainan (TW); Po-Chun Chen, Tainan (TW); Hong-Yi Fang, Tainan (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/261,578

(22) Filed: Jan. 30, 2019

(65) Prior Publication Data

US 2020/0227269 A1    Jul. 16, 2020

(30) Foreign Application Priority Data

Jan. 14, 2019    (CN) .......................... 2019 1 0030825

(51) Int. Cl.
| | |
|---|---|
| *H01L 21/3105* | (2006.01) |
| *H01L 21/027* | (2006.01) |
| *H01L 21/02* | (2006.01) |
| *H01L 21/311* | (2006.01) |
| *H01L 21/3213* | (2006.01) |
| *H01L 27/108* | (2006.01) |
| *H01L 29/66* | (2006.01) |

(52) U.S. Cl.
CPC .... *H01L 21/31058* (2013.01); *H01L 21/0276* (2013.01); *H01L 21/02118* (2013.01); *H01L 21/31144* (2013.01); *H01L 21/32139* (2013.01); *H01L 27/10876* (2013.01); *H01L 27/10885* (2013.01); *H01L 27/10891* (2013.01); *H01L 27/10897* (2013.01); *H01L 29/6656* (2013.01); *H01L 29/6659* (2013.01)

(58) Field of Classification Search
CPC ......... H01L 21/31058; H01L 21/02118; H01L 21/0276; H01L 21/32139; H01L 21/31144
USPC .......................................................... 438/275
See application file for complete search history.

(56) References Cited

U.S. PATENT DOCUMENTS

| | | | | |
|---|---|---|---|---|
| 6,316,321 B1 * | 11/2001 | Lin | ................... | H01L 21/28061 |
| | | | | 257/E21.2 |
| 6,429,068 B1 * | 8/2002 | Divakaruni | ....... | H01L 27/10891 |
| | | | | 257/E21.652 |

(Continued)

OTHER PUBLICATIONS

Yun, Study on Planarization Performance of Spin on Hardmask, May 31, 2018.

*Primary Examiner* — Duy T Nguyen
(74) *Attorney, Agent, or Firm* — Winston Hsu (57) ABSTRACT

A method of forming a dielectric layer includes the following steps. A substrate including a first area and a second area is provided. A plurality of patterns on the substrate of the first area and a blanket stacked structure on the substrate of the second area are formed. An organic dielectric layer covers the patterns, the blanket stacked structure and the substrate. The blanket stacked structure is patterned by serving the organic dielectric layer as a hard mask layer, thereby forming a plurality of stacked structures. The organic dielectric layer is removed. A dielectric layer blanketly covers the patterns, the stacked structures, and the substrate.

15 Claims, 5 Drawing Sheets

(56) References Cited

U.S. PATENT DOCUMENTS

| | | | |
|---|---|---|---|
| 7,517,817 B2 | 4/2009 | Goo | |
| 2007/0117412 A1* | 5/2007 | Goo | H01L 21/02164 |
| | | | 438/787 |
| 2012/0276745 A1* | 11/2012 | Jung | H01L 21/0337 |
| | | | 438/703 |
| 2013/0149851 A1* | 6/2013 | Li | H01L 29/40114 |
| | | | 438/585 |
| 2018/0254277 A1* | 9/2018 | Chen | H01L 27/10894 |

* cited by examiner

METHOD OF FORMING STACKED STRUCTURE OF MEMORY

BACKGROUND OF THE INVENTION

1. Field of the Invention

The present invention relates generally to a method of forming a dielectric layer, and more specifically to a method of forming a dielectric layer applying organic dielectric layers.

2. Description of the Prior Art

Dielectric materials are often deposited by spin-on dielectric (SOD) process or chemical vapor deposition (CVD) process. While using the spin-on dielectric (SOD) process, a flowable dielectric material can be coated into gaps in a substrate easily through adjusting dibasic ester (DBE) system. This is an unique advantage of the spin-on dielectric (SOD) process, and thus the spin-on dielectric (SOD) process is widely used in nowadays industry.

Trenches with different sizes are usually formed in a substrate. A dielectric material covers the surface of the trenches while coating the dielectric material on the substrate by the spin-on dielectric (SOD) process. However, as a plurality of spin-on coating processes and curing processes are performed to coat dielectric materials on different areas accompany with different pattern processes, devices are damaged due to complex processes, and process costs are increased as well.

SUMMARY OF THE INVENTION

The present invention provides a method of forming a dielectric layer, which replace a dielectric layer by an organic dielectric layer for serving as a hard mask while patterning stacked structures. This simplifies processes and reduces process costs.

The present invention provides a method of forming a dielectric layer including the following steps. A substrate including a first area and a second area is provided. A plurality of patterns on the substrate of the first area and a blanket stacked structure on the substrate of the second area are formed. An organic dielectric layer covers the patterns, the blanket stacked structure and the substrate. The blanket stacked structure is patterned by serving the organic dielectric layer as a hard mask layer, thereby forming a plurality of stacked structures. The organic dielectric layer is removed. A dielectric layer blanketly covers the patterns, the stacked structures, and the substrate.

According to the above, the present invention provides a method of forming a dielectric layer, which forms an organic dielectric layer covering patterns on a substrate of a first area, and a blanket stacked structure on the substrate of a second area, and then patterns the blanket stacked structure by serving the organic dielectric layer as a hard mask layer, thereby a plurality of stacked structures on the substrate of the second area being formed. Therefore, a dielectric layer can cover the patterns, the stacked structures and the substrate of the first area and the second area blanketly after the organic dielectric layer is removed. In this way, a step of forming a dielectric layer before the blanket stacked structure is patterned can be omitted once to avoid the thermal budget (caused by curing the dielectric layer) from damaging devices. Besides, the step of forming the dielectric layer in the first area and the second area is processed only once, and thus processes can be simplified.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
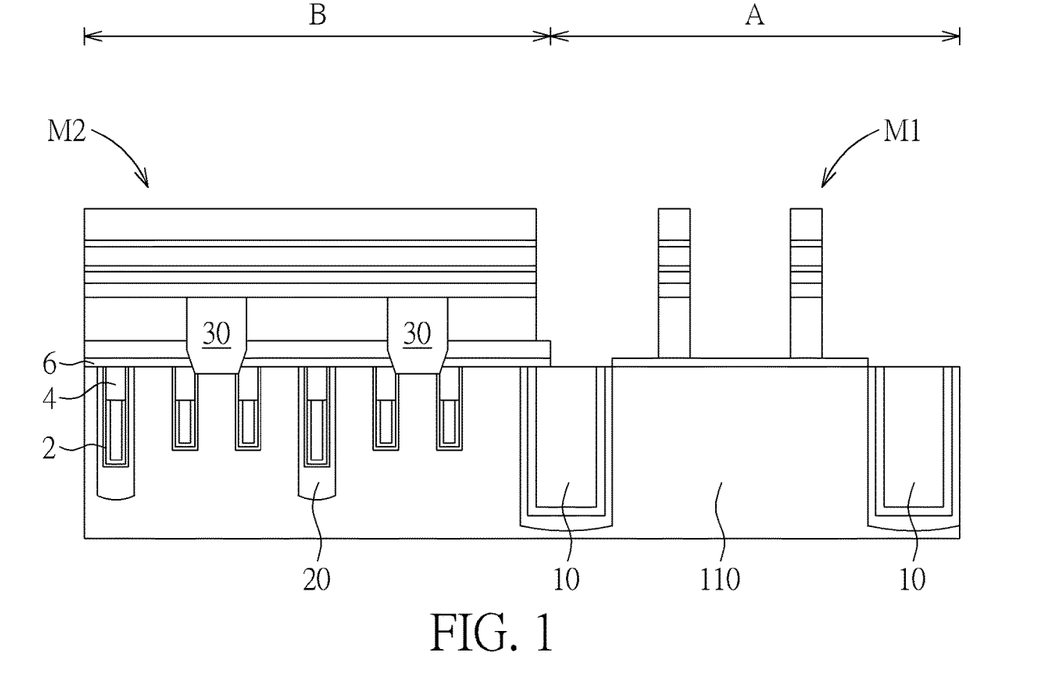
FIG. 1 schematically depicts a cross-sectional view of a method of forming a dielectric layer according to an embodiment of the present invention.

FIGS. 1-10 schematically depict cross-sectional views of a method of forming a dielectric layer according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate, a silicon-on-insulator (SOI) substrate or a substrate containing epitaxial layers. The substrate 110 may include a first area A and a second area B. In a preferred embodiment, the pattern density of the second area B is less than the pattern density of the first area A. For example, the first area A may be a logic area, and the second area B may be a dynamic random access memory area, but it is not limited thereto. In other embodiments, the first area A may be a logic area, and the second area B may be a static random access memory area; the first area A and the second area B may be logic areas; or, the first area A may be a logic area, and the second area B maybe a flash memory area. Isolation structures 10 are formed in the substrate 10. The isolation structures 10 are used for electrically isolating components in the first area A and the second area B from each other. The isolation structures 10 may be shallow trench isolation (STI) structures, which may be formed by a shallow trench isolation (STI) process, but it is not limited thereto.

The second area B is a dynamic random access memory area in this embodiment, and thus a plurality of embedded gate structures 20 are disposed in the substrate 110 of the second area B. The isolation structures 10 and isolation materials covering the substrate 110 of the second area B may include a silicon oxide layer 2, a silicon nitride layer 4, a silicon oxide layer 6 and etc, and silicon phosphorus structures 30 are formed on the substrate 110 of the second area B, but it is not limited thereto. In other embodiments, the first area A and the second area B may be logic areas, and the pattern density of the second area B is less than the pattern density of the first area A. Therefore, the steps of forming the embedded gate structures 20, the silicon oxide layer 2, the silicon nitride layer 4, the silicon oxide layer 6 and the silicon phosphorus structures 30 can be omitted, and the following step of forming stacked structures can be processed instead.

A plurality of patterns M1 are formed on the substrate 110 of the first area A and a blanket stacked structure M2 is formed on the substrate 110 of the second area B. More precisely, a plurality of material layers are deposited sequentially and blanketly, and then the patterns M1 of the first area A and the blanket stacked structure M2 of the second area B are formed at the same time by patterning using photoresists. In this case, the patterns M1 and the blanket stacked structure M2 are stacked structures, and each of these stacked structures may include a nitride layer with a thickness of 130 angstroms formed by an atomic layer deposition (ALD) process, an amorphous silicon layer with a thickness of 226 angstroms, a silicon titanium layer with a thickness of 50 angstroms, a titanium nitride layer with a thickness of 80 angstroms, a silicon tungsten layer with a thickness of 20 angstroms, a tungsten layer with a thickness of 230 angstroms, a lower nitride layer with a thickness of 20 angstroms and an upper nitride layer with a thickness of 345 angstroms stacked from bottom to top, but it is not limited thereto. The patterns M1 may be gates, and bit line gates can be formed from the blanket stacked structure M2 in later processes, but it is not restricted thereto. In other cases, the first area A and the second area B may both logic areas, and the patterns M1 and the blanket stacked structure M2 can be used as stacked structures of gates. Thereby, the stacked structures may include gates dielectric layer, gate electrodes and cap layers stacked from bottom to top.

Figure 2:
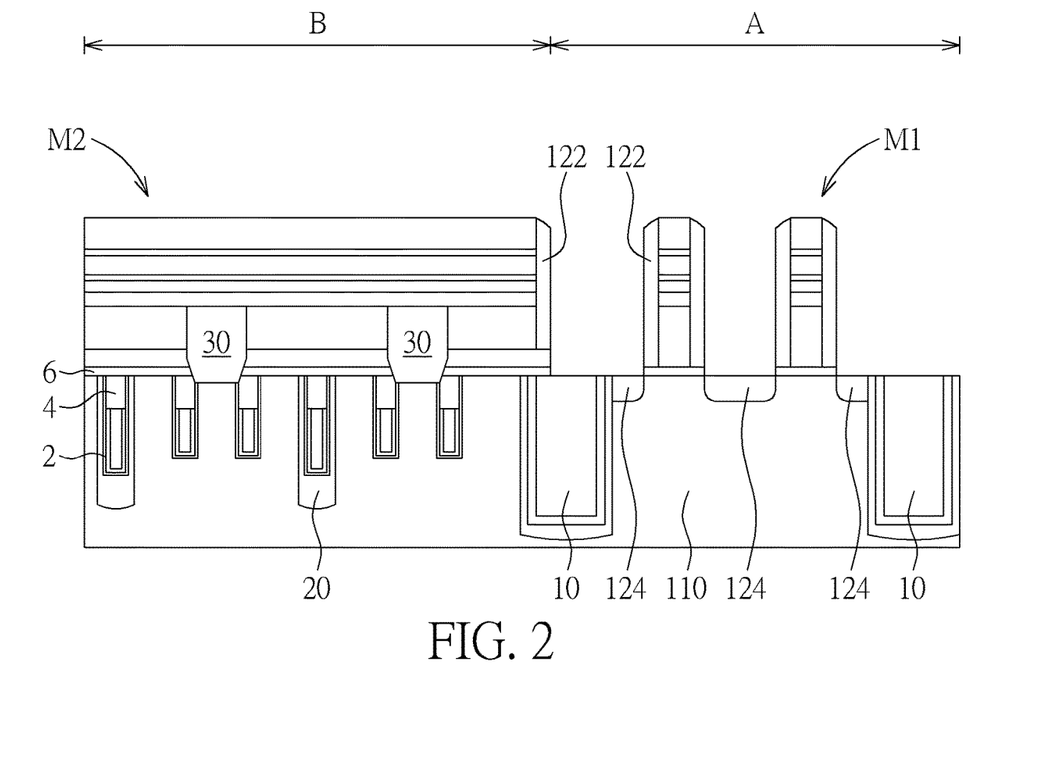
FIG. 2 schematically depicts a cross-sectional view of a method of forming a dielectric layer according to an embodiment of the present invention.

As shown in FIG. 2, first spacers 122 are formed on sidewalls of the patterns M1 and the blanket stacked structure M2, to define areas for forming lightly doped source/drains in the first area A. Lightly doped source/drains 124 are formed in the substrate 110 beside the first spacers 122 on the sidewalls of the patterns M1. More precisely, a photoresist may cover the second area B, and the lightly doped source/drains 124 are only formed in the substrate 110 beside the first spacers 122 on the sidewalls of the patterns M1. In this embodiment, the first spacers 122 are used for forming the lightly doped source/drains 124 only in the first area A, but the first spacers 122 are also formed on the sidewalls of the blanket stacked structure M2 in the second area B without the lightly doped source/drains being formed in the second area B.

Figure 3:
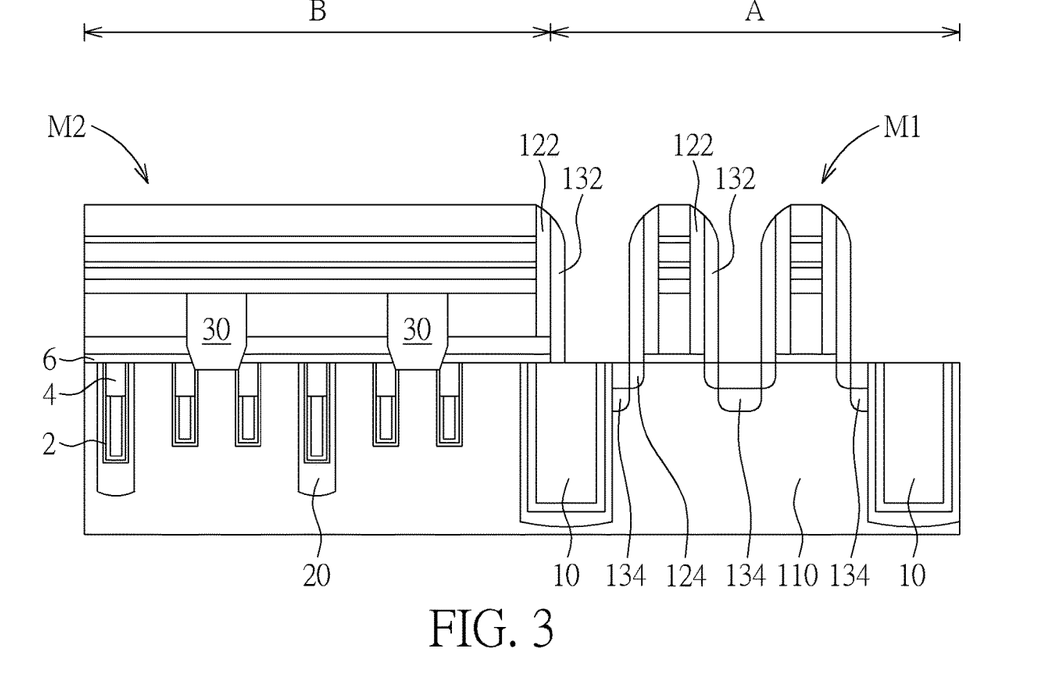
FIG. 3 schematically depicts a cross-sectional view of a method of forming a dielectric layer according to an embodiment of the present invention.

As shown in FIG. 3, second spacers 132 are formed on the sidewalls of the patterns M1 and the blanket stacked structure M2, to define areas for forming source/drains in the first area A. Source/drains 134 are formed in the substrate 110 beside the second spacers 132 on the sidewalls of the patterns M1. More precisely, a photoresist may cover the second area B, and the source/drains 134 are only formed in the substrate 110 beside the second spacers 132 on the sidewalls of the patterns M1. In this embodiment, the second spacers 132 are used for forming the source/drains 134 only in the first area A, but the second spacers 132 are also formed on the sidewalls of the blanket stacked structure M2 in the second area B without the source/drains being formed in the second area B.

Figure 4:
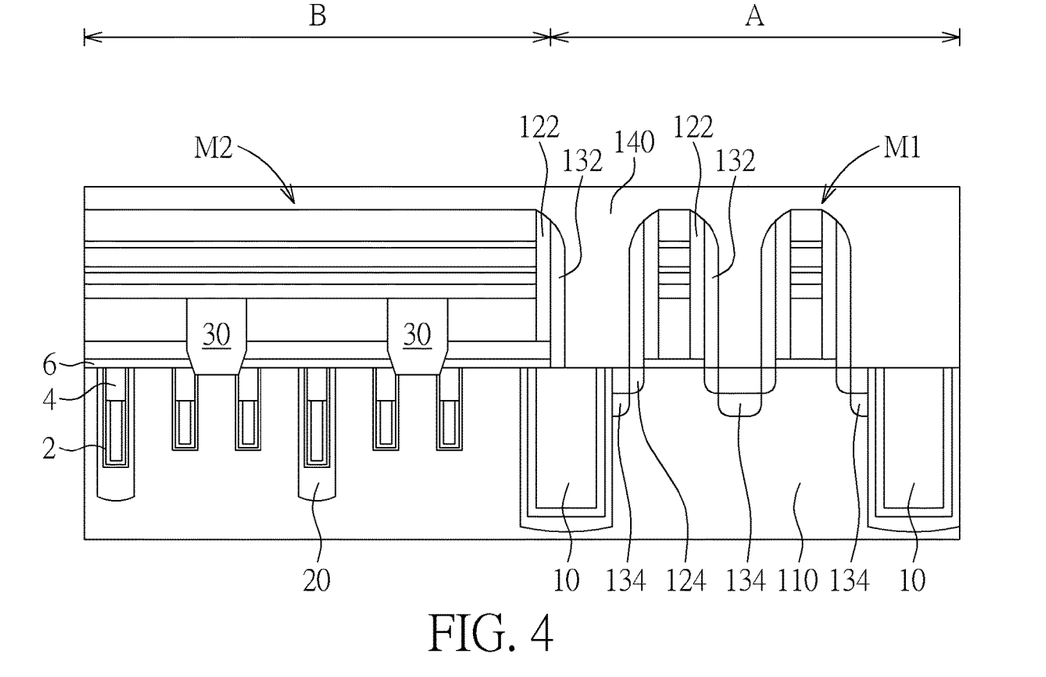
FIG. 4 schematically depicts a cross-sectional view of a method of forming a dielectric layer according to an embodiment of the present invention.

As shown in FIG. 4, an organic dielectric layer 140 are formed to cover the patterns M1, the blanket stacked structure M2 and the substrate 110 in the first area A and the second area B. The organic dielectric layer 140 may be formed by a spin on coating (SOC) process, but it is not limited thereto.

Figure 5:
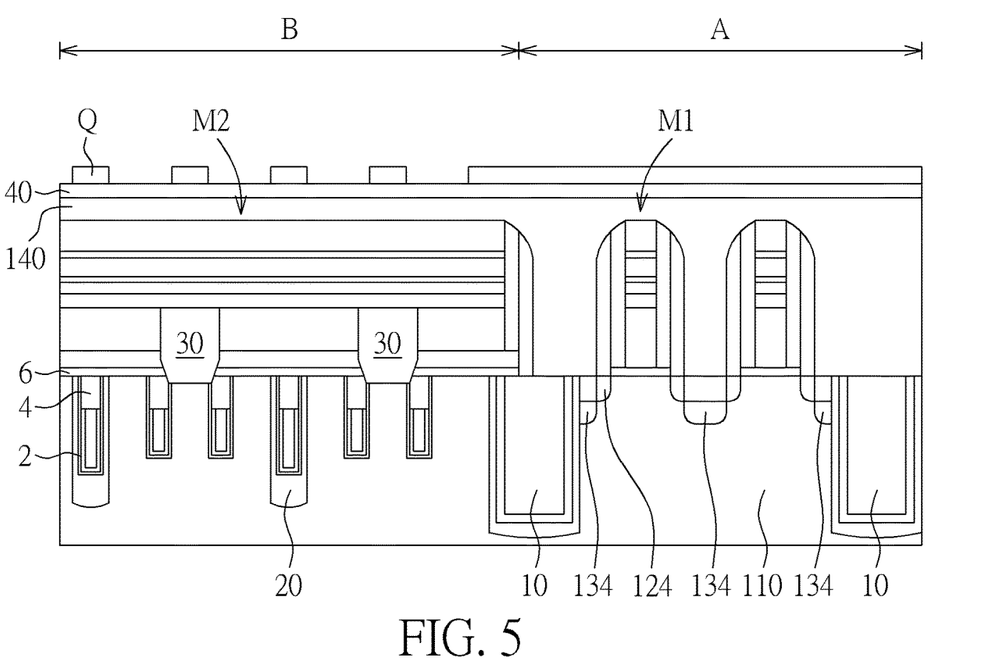
FIG. 5 schematically depicts a cross-sectional view of a method of forming a dielectric layer according to an embodiment of the present invention.
Figure 6:
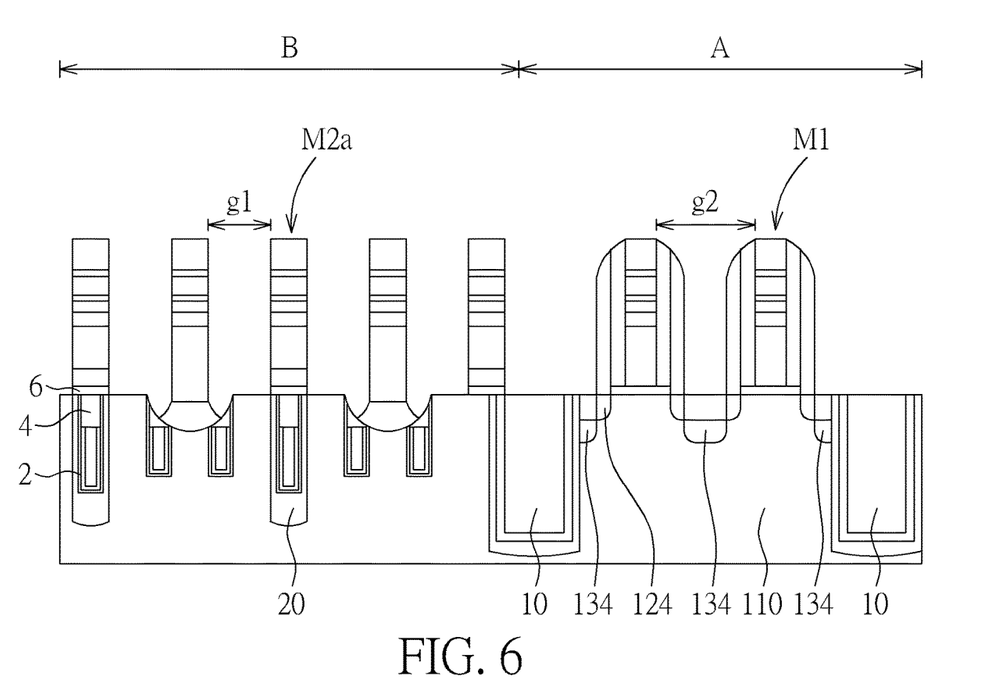
FIG. 6 schematically depicts a cross-sectional view of a method of forming a dielectric layer according to an embodiment of the present invention.

As shown in FIGS. 5-6, the blanket stacked structure M2 is patterned to form a plurality of stacked structures M2a. The organic dielectric layer 140 serves as a hard mask layer to pattern the blanket stacked structure M2. As shown in FIG. 5, a silicon-containing hard mask bottom anti-reflective coating layer 40 and a photoresist layer Q are sequentially formed on the organic dielectric layer 140, the patterns of the photoresist layer Q are transferred into the silicon-containing hard mask bottom anti-reflective coating layer 40, the patterns of the silicon-containing hard mask bottom anti-reflective coating layer 40 are transferred into the organic dielectric layer 140, and then the patterns of the organic dielectric layer 140 are transferred into the blanket stacked structure M2, so that the plurality of stacked structures M2a are formed, as shown in FIG. 6. Thereafter, the organic dielectric layer 140 is removed. In a preferred embodiment, the organic dielectric layer 140 may be removed by an $O_2$ strip process, but it is not limited thereto. In this case, the plurality of stacked structures M2a are bit line gates, but it is not restricted thereto. Material layers constituting the stacked structures M2a and the functions of the stacked structures M2a depend upon practical requirements. Gaps g1 between the stacked structures M2a in the second area B are less than gaps g2 between the patterns M1 in the first area A, and thus the patterns M1 are formed and then the blanket stacked structure M2 is patterned. Thereby, spacers of four layers are formed in the first area A and dual spacers are formed in the second area B in later processes.

It is emphasized, a dielectric layer in the first area A is replaced by the organic dielectric layer 140, and the organic dielectric layer 140 can serve as a hard mask layer for patterning the blanket stacked structure M2, thereby steps of forming the dielectric layer, curing the dielectric layer and planarizing the dielectric layer can be omitted. Moreover, the thermal budget caused by curing the dielectric layer such as performing an annealing process can be avoided to damage devices.

Figure 7:
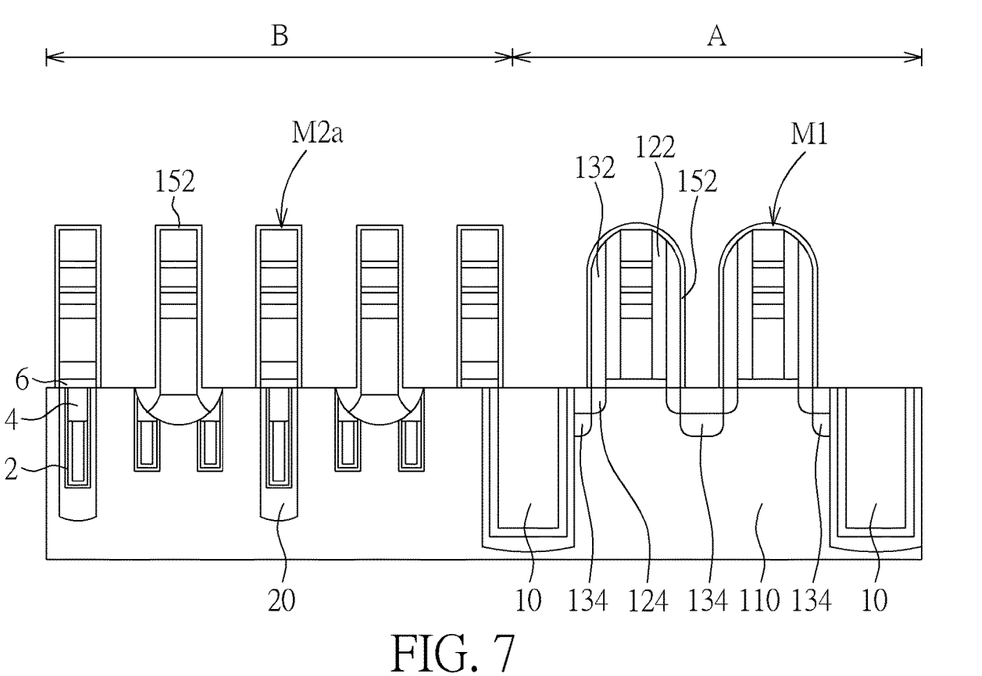
FIG. 7 schematically depicts a cross-sectional view of a method of forming a dielectric layer according to an embodiment of the present invention.

As shown in FIG. 7, third spacers 152 are formed on the sidewalls of the patterns M1 and the stacked structures M2a, to define areas for forming lightly doped source/drains in the second area B. Lightly doped source/drains (not shown) are formed in the substrate 110 beside the third spacers 152 on the sidewalls of the stacked structures M2a. More precisely, a photoresist may cover the first area A, and the lightly doped source/drains (not shown) are only formed in the substrate 110 beside the third spacers 152 on the sidewalls of the stacked structures M2a. In this embodiment, the third spacers 152 are formed not only in the first area A but also in the second area B.

Figure 8:
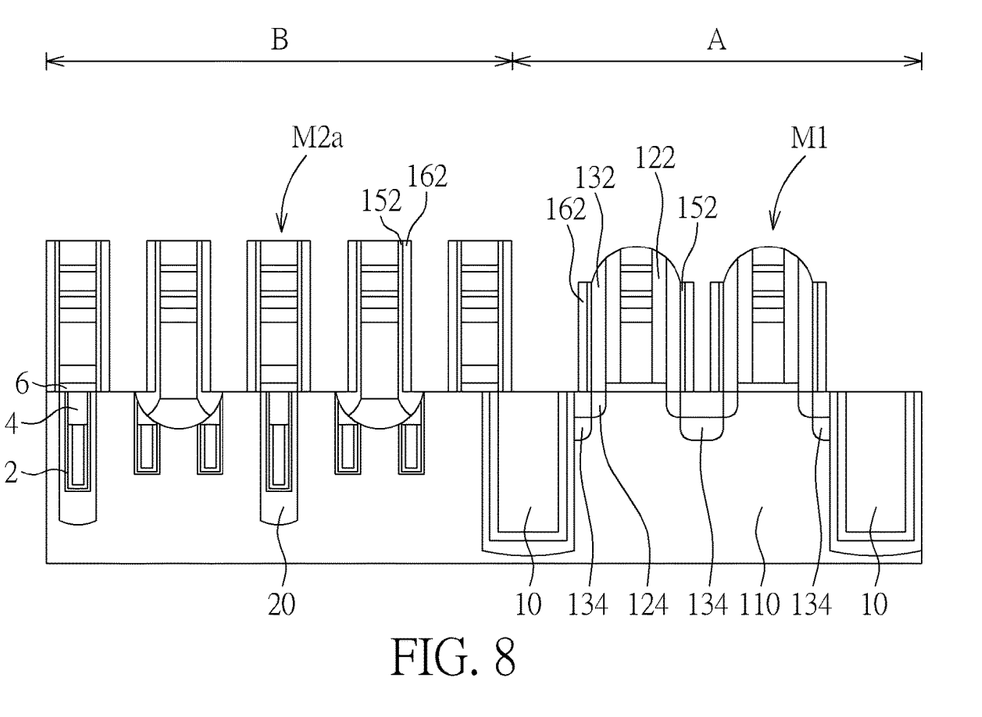
FIG. 8 schematically depicts a cross-sectional view of a method of forming a dielectric layer according to an embodiment of the present invention.

As shown in FIG. 8, fourth spacers 162 are formed on the sidewalls of the patterns M1 and the stacked structures M2a, to define areas for forming source/drains in the second area B. Source/drains (not shown) are formed in the substrate 110 beside the fourth spacers 162 on the sidewalls of the stacked structures M2a. More precisely, a photoresist may cover the first area A, and the source/drains (not shown) are only formed in the substrate 110 beside the fourth spacers 162 on the sidewalls of the stacked structures M2a. In this embodiment, the fourth spacers 162 are formed not only in the first area A but also in the second area B. As the fourth spacers 162 are formed in the first area A and the second area B by etching, parts of the third spacers 152 on top surfaces of the patterns M1 and the stacked structures M2a in the first area A and the second area B may be removed partially or completely.

Figure 9:
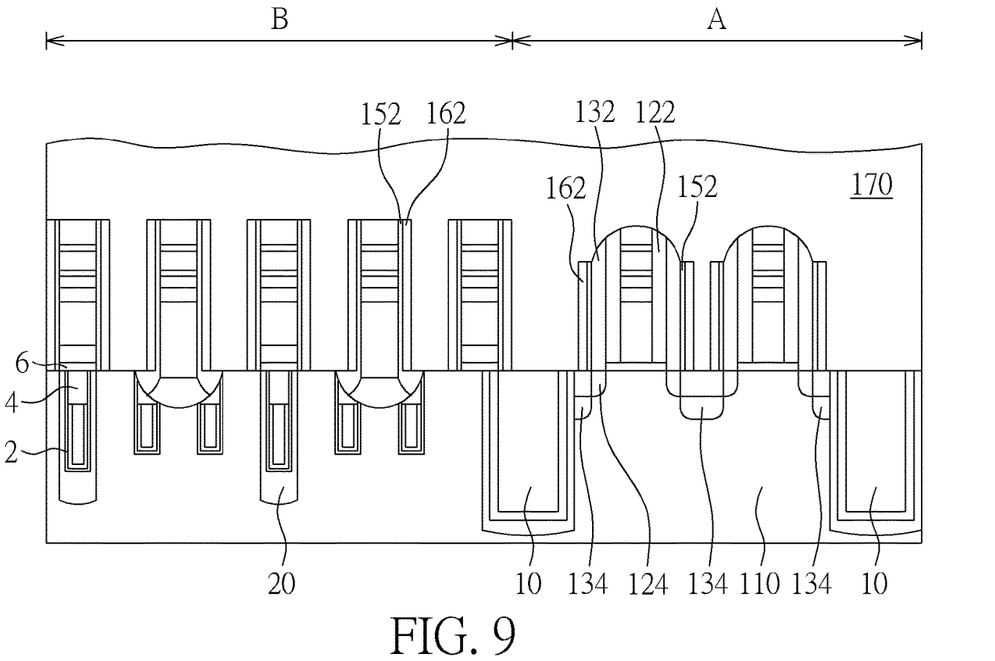
FIG. 9 schematically depicts a cross-sectional view of a method of forming a dielectric layer according to an embodiment of the present invention.

As shown in FIG. 9, a dielectric layer 170 may be formed to cover the patterns M1, the stacked structures M2a and the substrate 110 blanketly. The dielectric layer 170 may be formed by a spin on dielectric (SOD) process, but it is not limited thereto. The dielectric layer 170 may be formed not only in the first area A but also in the second area B.

Figure 10:
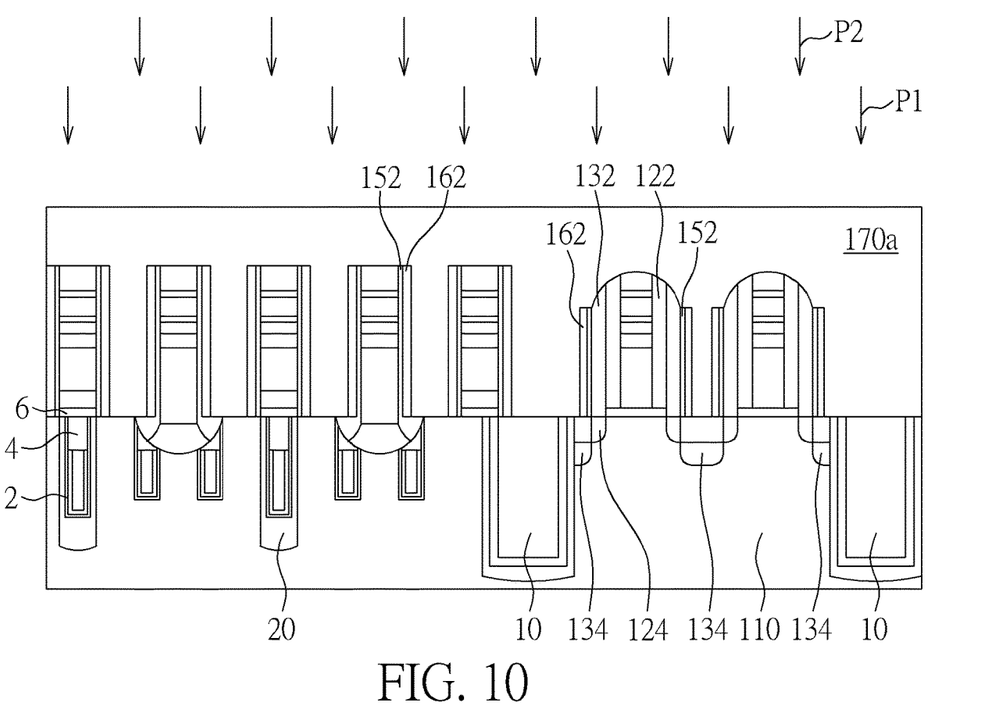
FIG. 10 schematically depicts a cross-sectional view of a method of forming a dielectric layer according to an embodiment of the present invention.

Thereafter, a curing process P1 is performed on the dielectric layer 170, and then a polishing process P2 is performed on the dielectric layer 170, as shown in FIGS. 9-10. After the dielectric layer 170 covers the patterns M1, the stacked structures M2a and the substrate 110 blanketly, the curing process P1 may be performed on the dielectric layer 170 to cure the dielectric layer 170. The curing process P1 may be an annealing process, but it is not limited thereto. Then, the polishing process P2 is performed on the dielectric layer 170 to form a dielectric layer 170a having a flat top surface. Hence, the step of forming the dielectric layer 170 in the first area A and the second area B is only performed once in the present invention. This simplifies processes and reduces device damage.

To summarize, the present invention provides a method of forming a dielectric layer, which forms an organic dielectric layer covering patterns on a substrate of a first area, and a blanket stacked structure on the substrate of a second area, and then patterns the blanket stacked structure by serving the organic dielectric layer as a hard mask layer, thereby a plurality of stacked structures on the substrate of the second area being formed. Therefore, a dielectric layer can cover the patterns, the stacked structures and the substrate of the first area and the second area blanketly after the organic dielectric layer is removed. In this way, a step of forming a dielectric layer before the blanket stacked structure is patterned (which may include a spin on coating process to form the dielectric layer, a curing process and a planarization process) can be omitted once to avoid the thermal budget (caused by curing the dielectric layer) from damaging devices. Hence, only one step of forming the dielectric layer in the first area and the second area is processed. This simplifies processes and reduces device damage.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming stacked structures of a memory, comprising:
   providing a substrate comprising a first area and a second area;
   forming a plurality of patterns on the first area of the substrate and a blanket stacked structure on the second area of the substrate;
   forming an organic dielectric layer covering the patterns, the blanket stacked structure and the substrate;
   patterning the blanket stacked structure by serving the organic dielectric layer as a hard mask layer, thereby forming a plurality of stacked structures;
   removing the organic dielectric layer completely after the blanket stacked structure is patterned; and
   forming a dielectric layer blanketly covering the patterns, the stacked structures, and the substrate.

2. The method of forming the stacked structures of the memory according to claim 1, wherein gaps between the stacked structures in the second area are less than gaps between the patterns in the first area.

3. The method of forming the stacked structures of the memory according to claim 2, wherein the first area comprises a logic area while the second area comprises a dynamic random access memory area.

4. The method of forming the stacked structures of the memory according to claim 3, wherein the patterns comprise gates, and the stacked structures comprise bit line gates.

5. The method of forming the stacked structures of the memory according to claim 1, further comprising:
   sequentially forming a silicon-containing hard mask bottom anti-reflective coating layer and a photoresist layer on the organic dielectric layer after the organic dielectric layer covering the patterns, the blanket stacked structure and the substrate is formed, and the blanket stacked structure is patterned by sequentially transferring patterns of the photoresist layer, the silicon-containing hard mask bottom anti-reflective coating layer and the organic dielectric layer.

6. The method of forming the stacked structures of the memory according to claim 1, wherein the organic dielectric layer is removed by an O2 stripping process.

7. The method of forming the stacked structures of the memory according to claim 1, further comprising:
   forming first spacers on sidewalls of the patterns and the blanket stacked structure before the organic dielectric layer covering the patterns, the blanket stacked structure and the substrate is formed.

8. The method of forming the stacked structures of the memory according to claim 7, further comprising:
   forming lightly doped sources/drains in the substrate beside the first spacers on the sidewalls of the patterns.

9. The method of forming the stacked structures of the memory according to claim 7, further comprising:
   forming second spacers on the sidewalls of the patterns and the blanket stacked structure after the first spacers are formed.

10. The method of forming the stacked structures of the memory according to claim 9, further comprising:
    forming sources/drains in the substrate beside the second spacers on the sidewalls of the patterns.

11. The method of forming the stacked structures of the memory according to claim 1, further comprising:
    forming third spacers on sidewalls of the patterns and the stacked structures after the organic dielectric layer is removed.

12. The method of forming the stacked structures of the memory according to claim 11, further comprising:
    forming lightly doped sources/drains in the substrate beside the third spacers on the sidewalls of the stacked structures.

13. The method of forming the stacked structures of the memory according to claim 11, further comprising:
    forming fourth spacers on the sidewalls of the patterns and the stacked structures after the third spacers are formed.

14. The method of forming the stacked structures of the memory according to claim 13, further comprising:
  forming sources/drains in the substrate beside the fourth spacers on the sidewalls of the stacked structures.

15. The method of forming the stacked structures of the memory according to claim 1, further comprising:
  performing a curing process on the dielectric layer, and then performing a polishing process on the dielectric layer.

\* \* \* \* \*